(12) United States Patent
Tai et al.

(10) Patent No.: US 11,895,778 B2
(45) Date of Patent: Feb. 6, 2024

(54) ETCHING METHOD FOR MANUFACTURING SUBSTRATE STRUCTURE HAVING THICK ELECTRICALLY CONDUCTIVE LAYER, AND SUBSTRATE STRUCTURE HAVING THICK ELECTRICALLY CONDUCTIVE LAYER

(71) Applicant: AMULAIRE THERMAL TECHNOLOGY, INC., New Taipei (TW)

(72) Inventors: Shih-Hsi Tai, New Taipei (TW); Tung-Ho Tao, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 103 days.

(21) Appl. No.: 17/552,907

(22) Filed: Dec. 16, 2021

(65) Prior Publication Data
US 2023/0199969 A1 Jun. 22, 2023

(51) Int. Cl.
H05K 1/02 (2006.01)
H05K 3/06 (2006.01)

(52) U.S. Cl.
CPC ........... H05K 3/061 (2013.01); H05K 1/0207 (2013.01); *H05K 2201/0166* (2013.01)

(58) Field of Classification Search
CPC .. H05K 1/0201; H05K 1/0204; H05K 1/0207; H05K 1/0373; H05K 3/0061; H05K 7/205; H05K 2201/06; H05K 2201/068; H05K 1/0306; H05K 3/02; H05K 3/04; H05K 3/041; H05K 3/043; H05K 2201/09281; H05K 2201/093
See application file for complete search history.

(56) References Cited

U.S. PATENT DOCUMENTS

| 2008/0197353 A1* | 8/2008 | Takahashi | ............... H01L 24/05 |
| | | | 257/E21.531 |
| 2020/0163218 A1* | 5/2020 | Mok | ..................... H05K 3/4038 |

* cited by examiner

*Primary Examiner* — Jeremy C Norris
(74) *Attorney, Agent, or Firm* — Li & Cai Intellectual Property (USA) Office

(57) ABSTRACT

An etching method for manufacturing a substrate structure having a thick electrically conductive layer, and a substrate structure having a thick electrically conductive layer are provided. The etching method includes providing an electrically insulating substrate structure including a thermally conductive and electrically insulating layer, an electrically conductive layer, and a non-photosensitive polymer masking layer, removing one part of the non-photosensitive polymer masking layer and one part of the electrically conductive layer by a machining process to form at least one electrically conductive recess having the electrically conductive layer exposed, forming a predetermined thickness ratio between a thickness of the electrically conductive recess and a thickness of the electrically conductive layer, removing a reserved part of the electrically conductive layer between a bottom wall of the electrically conductive recess and a bottom surface of the electrically conductive layer, and removing a remaining part of the non-photosensitive polymer masking layer.

10 Claims, 2 Drawing Sheets

ETCHING METHOD FOR MANUFACTURING SUBSTRATE STRUCTURE HAVING THICK ELECTRICALLY CONDUCTIVE LAYER, AND SUBSTRATE STRUCTURE HAVING THICK ELECTRICALLY CONDUCTIVE LAYER

FIELD OF THE DISCLOSURE

The present disclosure relates to a substrate structure, and more particularly to an etching method for manufacturing a substrate structure having a thick electrically conductive layer, and a substrate structure having a thick electrically conductive layer.

BACKGROUND OF THE DISCLOSURE

A circuit pattern is usually formed by a process of etching metal. However, when forming the circuit pattern, a large amount of chemical solution is required for an etching process of a thick metal layer, and a machining process of the thick metal layer can easily damage the substrate.

SUMMARY OF THE DISCLOSURE

In response to the above-referenced technical inadequacies, the present disclosure provides an etching method for manufacturing a substrate structure having a thick electrically conductive layer, and a substrate structure having a thick electrically conductive layer.

In one aspect, the present disclosure provides an etching method for manufacturing a substrate structure having a thick electrically conductive layer, which includes (a) providing an electrically insulating substrate structure including a thermally conductive and electrically insulating layer, an electrically conductive layer, and a non-photosensitive polymer masking layer; the electrically conductive layer is arranged above the thermally conductive and electrically insulating layer, and the non-photosensitive polymer masking layer covers the electrically conductive layer, (b) removing one part of the non-photosensitive polymer masking layer and one part of the electrically conductive layer that is arranged below the non-photosensitive polymer masking layer by a machining process, so as to form at least one electrically conductive recess having the electrically conductive layer exposed therefrom, and forming a predetermined thickness ratio between a thickness of the electrically conductive recess and a thickness of the electrically conductive layer, so that the electrically insulating substrate structure is made into a preprocessed substrate structure, and (c) removing another part of the electrically conductive layer that is reserved between a bottom wall of the electrically conductive recess and a bottom surface of the electrically conductive layer, and removing a remaining part of the non-photosensitive polymer masking layer, so as to obtain a substrate structure having the thick electrically conductive layer that is patterned.

In certain embodiments, the non-photosensitive polymer masking layer is made of epoxy resin, acrylic resin, polyurethane (PU) resin, or polyimide (PI) resin.

In certain embodiments, the thermally conductive and electrically insulating layer is made of a composite material including a polymer material and a thermally conductive powder.

In certain embodiments, in (b), the method further includes forming a predetermined width ratio between a width of an opening of the electrically conductive recess and a width of the bottom wall of the electrically conductive recess. The predetermined width ratio is from 0.8:1 to 1:1.

In certain embodiments, the thickness of the electrically conductive layer is from 0.5 mm to 6 mm.

In certain embodiments, when the thickness of the electrically conductive layer is from 0.5 mm to 1 mm, the predetermined thickness ratio between the thickness of the electrically conductive recess and the thickness of the electrically conductive layer is from 0.6:1 to 0.99:1.

In certain embodiments, when the thickness of the electrically conductive layer is from 1 mm to 3 mm, the predetermined thickness ratio between the thickness of the electrically conductive recess and the thickness of the electrically conductive layer is from 0.8:1 to 0.99:1.

In certain embodiments, when the thickness of the electrically conductive layer is from 3 mm to 6 mm, the predetermined thickness ratio between the thickness of the electrically conductive recess and the thickness of the electrically conductive layer is from 0.9:1 to 0.99:1.

In another aspect, the present disclosure provides a substrate structure having a thick electrically conductive layer, which includes a thermally conductive and electrically insulating layer, an electrically conductive layer, and a non-photosensitive polymer masking layer. The electrically conductive layer is arranged above the thermally conductive and electrically conductive layer. The non-photosensitive polymer masking layer covers the electrically conductive layer. At least one electrically conductive recess having the electrically conductive layer exposed therefrom is arranged in the electrically conductive layer. The at least one electrically conductive recess is formed by removing one part of the non-photosensitive polymer masking layer and one part of the electrically conductive layer that is arranged below the non-photosensitive polymer masking layer by a machining process, and a predetermined thickness ratio between a thickness of the electrically conductive recess and a thickness of the electrically conductive layer is formed.

In certain embodiments, the electrically conductive recess is a metal electrically conductive recess formed by removing the one part of the non-photosensitive polymer masking layer and the one part of the electrically conductive layer that is arranged below the non-photosensitive polymer masking layer by the machining process of milling.

In certain embodiments, the electrically conductive recess is a metal electrically conductive recess formed by removing the one part of the non-photosensitive polymer masking layer and the one part of the electrically conductive layer that is arranged below the non-photosensitive polymer masking layer by the machining process of turning.

In certain embodiments, the electrically conductive recess is a metal electrically conductive recess formed by removing the one part of the non-photosensitive polymer masking layer and the one part of the electrically conductive layer that is arranged below the non-photosensitive polymer masking layer by electrical discharge machining.

In certain embodiments, the thermally conductive and electrically insulating layer further has a metal thermally conductive layer arranged therebelow.

In certain embodiments, the metal thermally conductive layer has a heat dissipation structure arranged therein, and the heat dissipation structure has a liquid cooling passage.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
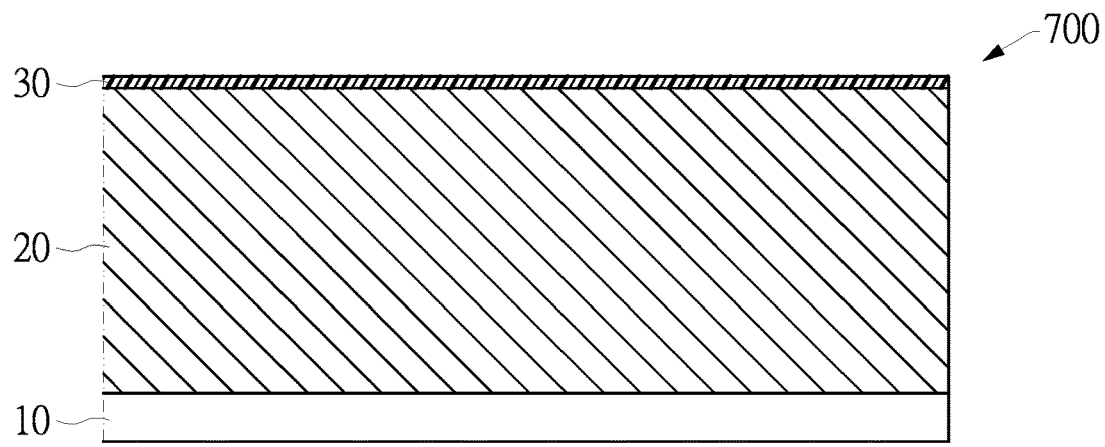
FIG. 1 is a schematic side view of a substrate structure according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

[Embodiments]

Figure 2:
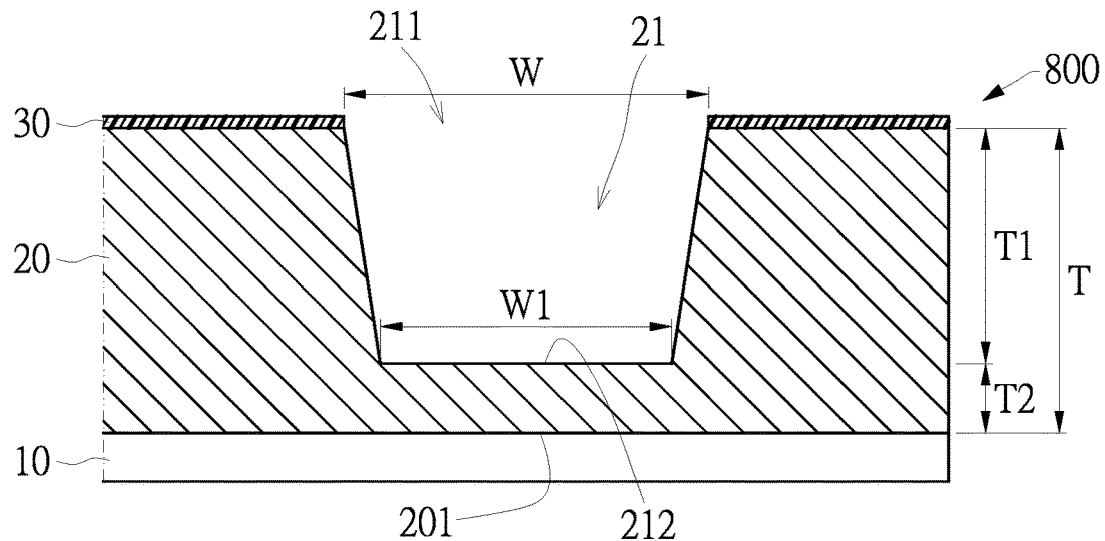
FIG. 2 is a schematic side view of the substrate structure according to another embodiment of the present disclosure.
Figure 3:
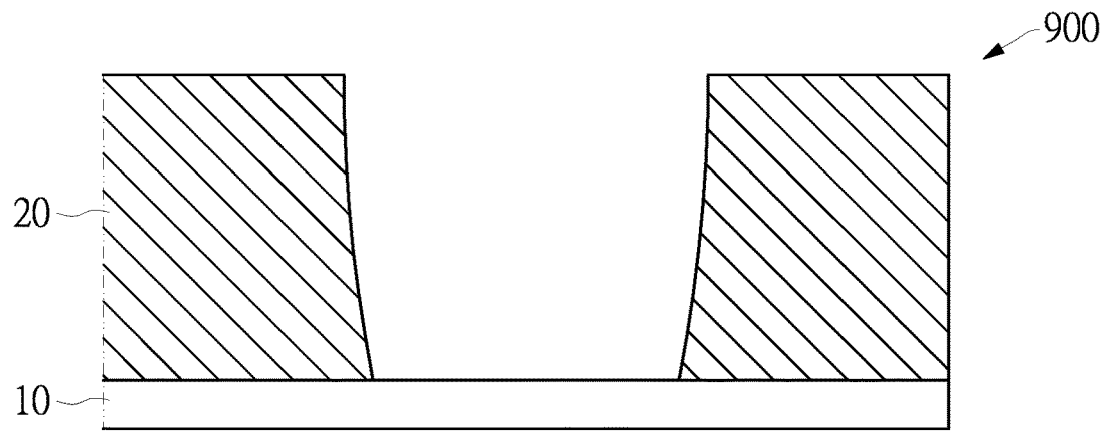
FIG. 3 is a schematic side view of the substrate structure according to yet another embodiment of the present disclosure.

Referring to FIG. 1 to FIG. 3, one particular embodiment of the present disclosure provides an etching method for manufacturing a substrate structure having a thick electrically conductive layer, which includes the following steps.

In step (a), an electrically insulating substrate structure 700 is provided as shown in FIG. 1. The electrically insulating substrate structure 700 includes a thermally conductive and electrically insulating layer 10, an electrically conductive layer 20 arranged on the thermally conductive and electrically conductive layer 10, and a non-photosensitive polymer masking layer 30 covering the electrically conductive layer 20.

More specifically, the thermally conductive and electrically insulating layer 10 is made of a composite material including a polymer material and a thermally conductive powder (e.g., a ceramic powder) so as to achieve a thermally conductive and electrically insulating effect. The electrically conductive layer 20 is a thick electrically conductive layer having a predetermined thickness that is made of metal. In one exemplary embodiment, a thickness T of the electrically conductive layer 20 is from 0.5 mm to 6 mm.

It is worth mentioning that, in the present embodiment, the masking layer used for masking the electrically conductive layer 20 is made of a non-photosensitive polymer material, that is, a polymer material that cannot be cured by light. In one exemplary embodiment, the non-photosensitive polymer masking layer 30 is made of epoxy resin, acrylic resin, polyurethane (PU) resin, or polyimide (PI) resin.

In step (b), one part of the non-photosensitive polymer masking layer 30 and one part of the electrically conductive layer 20 that is arranged below the non-photosensitive polymer masking layer 30 are removed by a machining process, so as to form at least one electrically conductive recess 21 having the electrically conductive layer 20 exposed therefrom, and a predetermined thickness ratio between a thickness T1 of the electrically conductive recess 21 and a thickness T of the electrically conductive layer 20 is formed as shown in FIG. 2, that is, a thickness of the metal layer (i.e., a depth of the metal layer) removed by the machining process is related to the thickness T of the electrically conductive layer 20, so that the electrically insulating substrate structure 700 as shown in FIG. 1 is made into a preprocessed substrate structure 800, i.e., a semi-finished product, as shown in FIG. 2.

In one exemplary embodiment, the one part of the non-photosensitive polymer masking layer 30 and the one part of the electrically conductive layer 20 that is arranged below the non-photosensitive polymer masking layer 30 are removed by the machining process of milling, so as to form the at least one electrically conductive recess 21 having the electrically conductive layer 20 exposed therefrom.

In one exemplary embodiment, the one part of the non-photosensitive polymer masking layer 30 and the one part of the electrically conductive layer 20 that is arranged below the non-photosensitive polymer masking layer 30 are removed by the machining process of turning, so as to form the at least one electrically conductive recess 21 having the electrically conductive layer 20 exposed therefrom.

In one exemplary embodiment, the one part of the non-photosensitive polymer masking layer 30 and the one part of the electrically conductive layer 20 that is arranged below the non-photosensitive polymer masking layer 30 are removed by electrical discharge machining, so as to form the at least one electrically conductive recess 21 having the electrically conductive layer 20 exposed therefrom.

Furthermore, a predetermined width ratio is formed between a width W of an opening 211 of the electrically conductive recess 21 and a width W1 of a bottom wall 212 of the electrically conductive recess 21, and the predetermined width ratio is from 0.8:1 to 1:1.

In step (c), another part of the electrically conductive layer 20 that is reserved between the bottom wall 212 of the electrically conductive recess 21 and a bottom surface 201 of the electrically conductive layer 20 as shown in FIG. 2 is removed as shown in FIG. 3. That is, the another part of the electrically conductive layer that is directly below the bottom wall 212 of the electrically conductive recess 21, and then removing a remaining part of the non-photosensitive polymer masking layer 30, so as to obtain a substrate structure having the thick electrically conductive layer that is patterned 900.

Further, a predetermined thickness ratio between a thickness T2 of the another part of the electrically conductive layer and the thickness T of the electrically conductive layer 20 is formed, so as to facilitate the removal of the another part of the electrically conductive layer between the bottom wall 212 of the electrically conductive recess 21 and the bottom surface 201 of the electrically conductive layer 20. The predetermined thickness ratio between the thickness T2 of the another part of the electrically conductive layer and the thickness T of the electrically conductive layer 20 is from 0.01:1 to 0.1:1.

In addition, when the thickness T of the electrically conductive layer 20 is from 0.5 mm to 1 mm, the predetermined thickness ratio between the thickness T1 of the electrically conductive recess 21 and the thickness T of the electrically conductive layer 20 is from 0.6:1 to 0.99:1.

When the thickness T of the electrically conductive layer 20 is from 1 mm to 3 mm, the predetermined ratio between the thickness T1 of the electrically conductive recess 21 and the thickness T of the electrically conductive layer 20 is from 0.8:1 to 0.99:1.

When the thickness T of the electrically conductive layer 20 is from 3 mm to 6 mm, the predetermined ratio between the thickness T1 of the electrically conductive recess 21 and the thickness T of the electrically conductive layer 20 is from 0.9:1 to 0.99:1.

Figure 4:
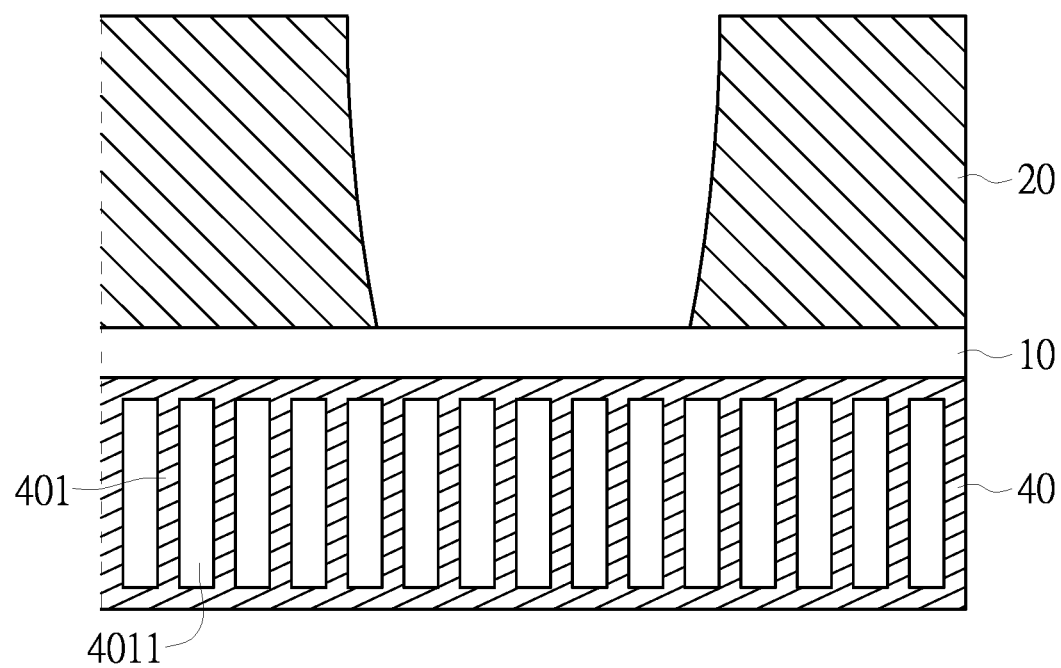
FIG. 4 is a schematic side view of the substrate structure according to still another embodiment of the present disclosure.

Furthermore, in one exemplary embodiment referred to in FIG. 4, the thermally conductive and electrically insulating layer 10 can further have a metal thermally conductive layer 40 arranged therebelow. The metal thermally conductive layer 40 can have a heat dissipation structure 401 arranged therein, and the heat dissipation structure 401 can be a plate fin structure or a pin fin structure, but is not limited thereto. In addition, the heat dissipation structure 401 of the metal thermally conductive layer 40 can further have a liquid cooling passage 4011 arranged therein, so as to form a passage for a working liquid to flow therethrough.

According to the above, one particular embodiment of the present disclosure provides a substrate structure having a thick electrically conductive layer, such as the preprocessed substrate structure 800 as shown in FIG. 2, which includes a thermally conductive and electrically insulating layer 10, an electrically conductive layer 20 arranged on the thermally conductive and electrically conductive layer 10, and a non-photosensitive polymer masking layer 30 covering the electrically conductive layer 20. At least one electrically conductive recess 21 having the electrically conductive layer 20 exposed therefrom is arranged in the electrically conductive layer 20. The at least one electrically conductive recess 21 is formed by removing one part of the non-photosensitive polymer masking layer 30 and one part of the electrically conductive layer 20 that is arranged below the non-photosensitive polymer masking layer 30 by a machining process, and a predetermined thickness ratio is formed between a thickness T1 of the electrically conductive recess 21 and a thickness T of the electrically conductive layer 20.

In one exemplary embodiment, the electrically conductive recess 21 is a metal electrically conductive recess formed by removing the one part of the non-photosensitive polymer masking layer 30 and the one part of the electrically conductive layer 20 that is arranged below the non-photosensitive polymer masking layer 30 by the machining process of milling.

In one exemplary embodiment, the electrically conductive recess 21 is a metal electrically conductive recess formed by removing the one part of the non-photosensitive polymer masking layer 30 and the one part of the electrically conductive layer 20 that is arranged below the non-photosensitive polymer masking layer 30 by the machining process of turning.

In one exemplary embodiment, the electrically conductive recess 21 is a metal electrically conductive recess formed by removing the one part of the non-photosensitive polymer masking layer 30 and the one part of the electrically conductive layer 20 that is arranged below the non-photosensitive polymer masking layer 30 by electrical discharge machining.

In one exemplary embodiment, a predetermined width ratio is formed between a width W of an opening 211 of the electrically conductive recess 21 and a width W1 of a bottom wall 212 of the electrically conductive recess 21, and the predetermined width ratio is from 0.8:1 to 1:1.

In one exemplary embodiment, a predetermined thickness ratio between a thickness T2 of another part of the electrically conductive layer 20 that is reserved between the bottom wall 212 of the electrically conductive recess 21 and a bottom surface 201 of the electrically conductive layer 20 and the thickness T of the electrically conductive layer 20 is formed, and the predetermined thickness ratio between the thickness T2 of the another part of the electrically conductive layer 20 that is reserved between the bottom wall 212 of the electrically conductive recess 21 and a bottom surface 201 of the electrically conductive layer 20 and the thickness T of the electrically conductive layer 20 is 0.01:1 to 0.1:1.

In one exemplary embodiment, the thickness T of the electrically conductive layer 20 is from 0.5 mm to 6 mm. When the thickness T of the electrically conductive layer 20 is from 0.5 mm to 1 mm, the predetermined thickness ratio between the thickness T1 of the electrically conductive recess 21 and the thickness T of the electrically conductive layer 20 is from 0.6:1 to 0.99:1. When the thickness T of the electrically conductive layer 20 is from 1 mm to 3 mm, the predetermined ratio between the thickness T1 of the electrically conductive recess 21 and the thickness T of the electrically conductive layer 20 is from 0.8:1 to 0.99:1. When the thickness T of the electrically conductive layer 20 is from 3 mm to 6 mm, the predetermined ratio between the thickness T1 of the electrically conductive recess 21 and the thickness T of the electrically conductive layer 20 is from 0.9:1 to 0.99:1.

In one exemplary embodiment, the thermally conductive and electrically insulating layer 10 can further have a metal thermally conductive layer 40 arranged therebelow.

[Beneficial Effects of the Embodiments]

In conclusion, in the etching method for manufacturing the substrate structure having the thick electrically conductive layer provided by the present disclosure, by virtue of "providing the electrically insulating substrate structure including the thermally conductive and electrically insulating layer, the electrically conductive layer arranged above the thermally conductive and electrically insulating layer, and the non-photosensitive polymer masking layer covering the electrically conductive layer", "removing the one part of the non-photosensitive polymer masking layer and the one part of the electrically conductive layer that is arranged below the non-photosensitive polymer masking layer by the machining process, so as to form the at least one electrically conductive recess having the electrically conductive layer exposed therefrom, and forming the predetermined thickness ratio between the thickness of the electrically conductive recess and the thickness of the electrically conductive layer, so that the electrically insulating substrate structure is made into the preprocessed substrate structure", and "removing the another part of the electrically conductive layer that is reserved between the bottom wall of the electrically conductive recess and the bottom surface of the electrically conductive layer, and removing the remaining part of the non-photosensitive polymer masking layer, so as to obtain the substrate structure having the thick electrically conductive layer that is patterned," the electrically conductive layer having the predetermined thickness is pre-formed with the electrically conductive recess by the machining process, and the predetermined thickness ratio is formed between the thickness of the electrically conductive recess resulting from the machining process and the thickness of the electrically conductive layer, so as to facilitate the subsequent etching process and reduce an amount of etching chemical solution that is used, thereby speeding up production and reducing costs associated therewith. Moreover, through pre-forming the electrically conductive recess, the thermally conductive and electrically insulating layer that is arranged below the electrically conductive layer can be effectively prevented from direct damage, vibration damage, or collapsing inward, which results in a significant decrease in bonding strength, insulating property, and thermal conductivity.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A substrate structure having a thick electrically conductive layer, comprising:
    a thermally conductive and electrically insulating layer;
    an electrically conductive layer arranged above the thermally conductive and electrically conductive layer; and
    a non-photosensitive polymer masking layer covering the electrically conductive layer;
    wherein at least one electrically conductive recess having the electrically conductive layer exposed therefrom is arranged in the electrically conductive layer;
    wherein the at least one electrically conductive recess is formed by removing one part of the non-photosensitive polymer masking layer and one part of the electrically conductive layer that is arranged below the non-photosensitive polymer masking layer by a machining process, and a predetermined thickness ratio between a thickness of the electrically conductive recess and a thickness of the electrically conductive layer is formed.

2. The substrate structure according to claim 1, wherein the thickness of the electrically conductive layer is from 0.5 mm to 6 mm.

3. The substrate structure according to claim 2, wherein, when the thickness of the electrically conductive layer is from 0.5 mm to 1 mm, the predetermined thickness ratio between the thickness of the electrically conductive recess and the thickness of the electrically conductive layer is from 0.6:1 to 0.99:1.

4. The substrate structure according to claim 2, wherein, when the thickness of the electrically conductive layer is from 1 mm to 3 mm, the predetermined thickness ratio between the thickness of the electrically conductive recess and the thickness of the electrically conductive layer is from 0.8:1 to 0.99:1.

5. The substrate structure according to claim 2, wherein, when the thickness of the electrically conductive layer is from 3 mm to 6 mm, the predetermined thickness ratio between the thickness of the electrically conductive recess and the thickness of the electrically conductive layer is from 0.9:1 to 0.99:1.

6. The substrate structure according to claim 1, wherein the electrically conductive recess is a metal electrically conductive recess formed by removing the one part of the non-photosensitive polymer masking layer and the one part of the electrically conductive layer that is arranged below the non-photosensitive polymer masking layer by the machining process of milling.

7. The substrate structure according to claim 1, wherein the electrically conductive recess is a metal electrically conductive recess formed by removing the one part of the non-photosensitive polymer masking layer and the one part of the electrically conductive layer that is arranged below the non-photosensitive polymer masking layer by the machining process of turning.

8. The substrate structure according to claim 1, wherein the electrically conductive recess is a metal electrically conductive recess formed by removing the one part of the non-photosensitive polymer masking layer and the one part of the electrically conductive layer that is arranged below the non-photosensitive polymer masking layer by electrical discharge machining.

9. The substrate structure according to claim 1, wherein the thermally conductive and electrically insulating layer further has a metal thermally conductive layer arranged therebelow.

10. The substrate structure according to claim 9, wherein the metal thermally conductive layer has a heat dissipation structure arranged therein, and the heat dissipation structure has a liquid cooling passage.

* * * * *